(12) United States Patent
Takeuchi et al.

(10) Patent No.: US 10,548,246 B2
(45) Date of Patent: Jan. 28, 2020

(54) ELECTRICAL POWER CONVERTER

(71) Applicant: DENSO CORPORATION, Kariya, Aichi-pref. (JP)

(72) Inventors: Kazuya Takeuchi, Kariya (JP); Taijiro Momose, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/212,857

(22) Filed: Dec. 7, 2018

(65) Prior Publication Data

US 2019/0182992 A1    Jun. 13, 2019

(30) Foreign Application Priority Data

Dec. 7, 2017    (JP) .................................. 2017-235357

(51) Int. Cl.
*H05K 7/20* (2006.01)
*H05K 5/00* (2006.01)

(52) U.S. Cl.
CPC ....... *H05K 7/20927* (2013.01); *H05K 5/0021* (2013.01); *H05K 7/20272* (2013.01); *H05K 7/20872* (2013.01)

(58) Field of Classification Search
CPC .............. H01L 23/473; H01L 31/0521; H05K 7/20927; H05K 7/1432; H05K 7/20254; H05K 7/2089; H05K 7/20281; H05K 7/20872; H05K 5/0021; H05K 7/20272; B60L 2210/20; B60L 2210/40; H02K 11/33
See application file for complete search history.

(56) References Cited

U.S. PATENT DOCUMENTS

| | | | | |
|---|---|---|---|---|
| 2008/0198548 A1* | 8/2008 | Nakamura | ......... | H05K 7/20927 361/689 |
| 2010/0097765 A1* | 4/2010 | Suzuki | .................. | B60K 6/365 361/699 |
| 2010/0321889 A1* | 12/2010 | Yoshino | ............. | H05K 7/20927 361/702 |
| 2010/0328893 A1* | 12/2010 | Higashidani | ....... | H05K 7/20927 361/702 |
| 2012/0093183 A1* | 4/2012 | Liu | ........................ | H01L 23/473 372/35 |
| 2012/0250252 A1* | 10/2012 | Iguchi | ................ | H05K 7/20927 361/689 |
| 2014/0140118 A1* | 5/2014 | Ishikawa | ............ | H05K 7/20927 363/141 |
| 2014/0284765 A1* | 9/2014 | Kiuchi | .................... | H01L 28/40 257/532 |
| 2015/0152987 A1* | 6/2015 | Ishikawa | .................. | F16L 5/12 285/350 |

* cited by examiner

*Primary Examiner* — Adam B Dravininkas
(74) *Attorney, Agent, or Firm* — Oliff PLC (57) ABSTRACT

An electric power converter is provided which includes a stack body made of a stack of a plurality of electronic devices and cooling medium flow paths in which cooling medium flows. The electric power converter also includes a housing in which the stack body is disposed. The housing 3 has a stack facing wall which faces the stack body in a stacking direction. The stack facing wall has an in-wall flow path in which the cooling medium flows and which communicates the cooling medium flow paths. This structure enables the electric power converter to be reduced in size thereof.

11 Claims, 6 Drawing Sheets

ELECTRICAL POWER CONVERTER

CROSS REFERENCE TO RELATED DOCUMENT

The present application claims the benefit of priority of Japanese Patent Application No. 2017-235357 filed on Dec. 7, 2017, the disclosure of which is incorporated herein by reference.

BACKGROUND

1 Technical Field

This disclosure relates generally to an electrical power converter.

2 Background Art

Japanese Patent First Publication No. 2014-102017 discloses an electrical power converter, such as an inverter, which includes a housing and electronic devices, such as, semiconductor modules, a reactor, and capacitors are mounted in the housing. The electrical power converter also includes first coolant paths for use in cooling the capacitors and the reactor as well as second coolant paths for use in cooling the semiconductor modules. The first coolant paths are formed in the housing, while the second coolant paths are formed in a coolant unit made of a stack of the semiconductor modules and cooling plates.

The first coolant paths in the coolant unit and the second coolant paths in the housing are connected to each other. A cooling medium or coolant flows in sequence through the first and second cooling paths to cool the electronic devices. The first cooling paths and the second cooling paths are joined together through connecting pipes arranged outside the housing.

The above structure, however, faces the drawback in that dead spaces are created around the connecting pipes disposed outside the housing, which may cause difficulties in reducing the size of the electrical power converter, that is, in conserving space for installation of the electrical power converter in vehicles.

SUMMARY

It is an object of this disclosure to provide an electrical power converter whose size is easily reduced.

According to one aspect of this disclosure, there is provided an electric power converter which comprises: (a) a stack body which is made of a stack of a plurality of electronic devices and in-stack flow paths through which a cooling medium flows; and (b) a housing in which the stack body is disposed. The housing has a stack facing wall which faces the stack body in a stacking direction in which the electronic devices and the in-stack flow paths are stacked.

The stack facing wall has an in-wall flow path in which the cooling medium flows. The in-wall flow path communicates with the in-stack flow paths.

The housing of the electrical power converter, as described above, has the in-wall flow path connecting with the in-stack flow paths. The in-wall flow path is formed in the stack facing wall. This achieves a simple joint between the in-stack flow paths and the in-wall flow path within the housing without need for a connecting pipe arranged outside the housing to connect the in-stack flow paths and the in-wall flow path together. This enables the electrical power converter to be reduced in size thereof.

In this disclosure, symbols in brackets represent correspondence relation between terms in claims and terms described in embodiments which will be discussed later, but are not limited only to parts referred to in the disclosure.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

First Embodiment

The electrical power converter 1 according to the first embodiment will be described below with reference to FIGS. 1 to 9.

Figure 1:
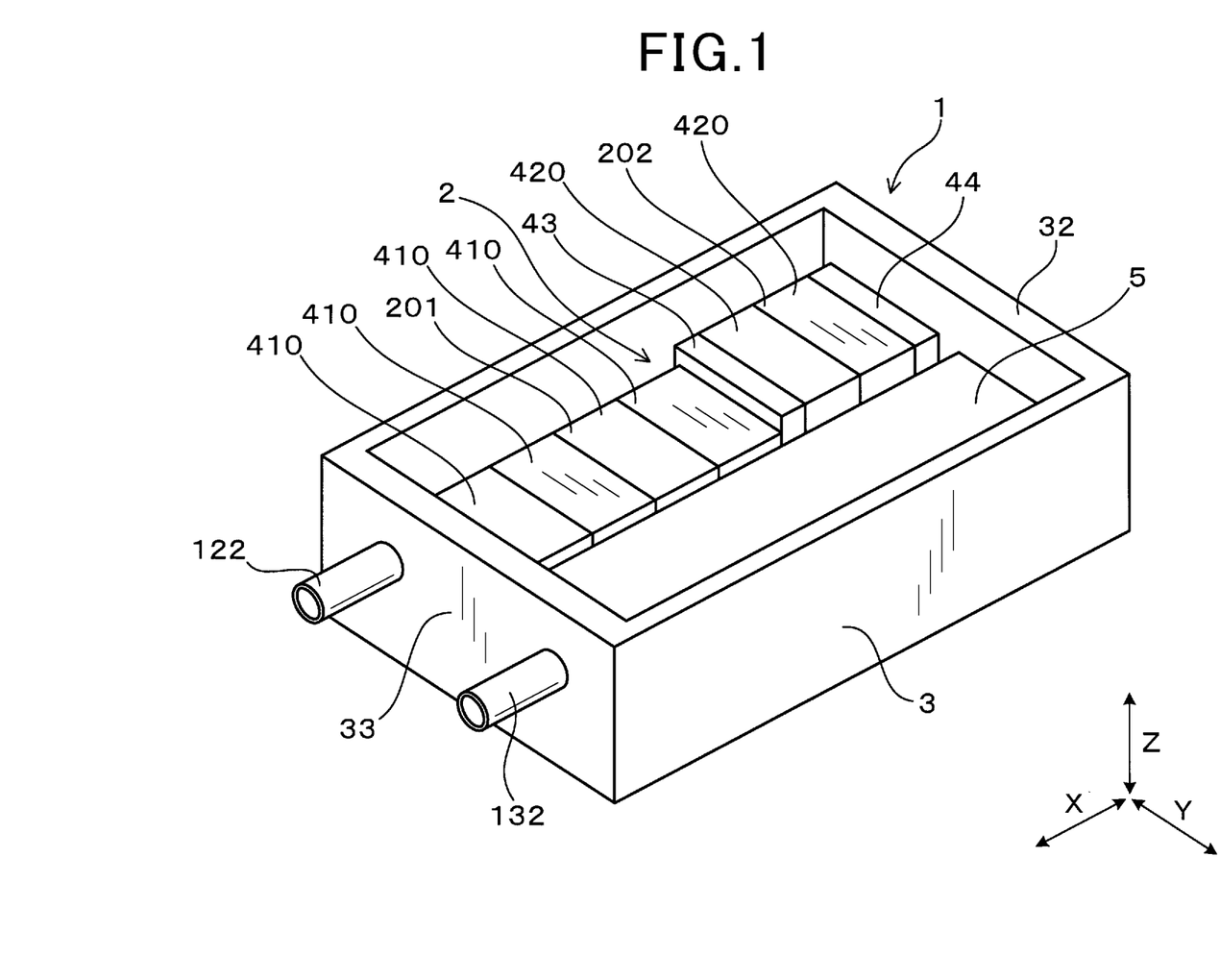
FIG. 1 is a perspective view which illustrates an electric power converter according to an embodiment.
Figure 2:
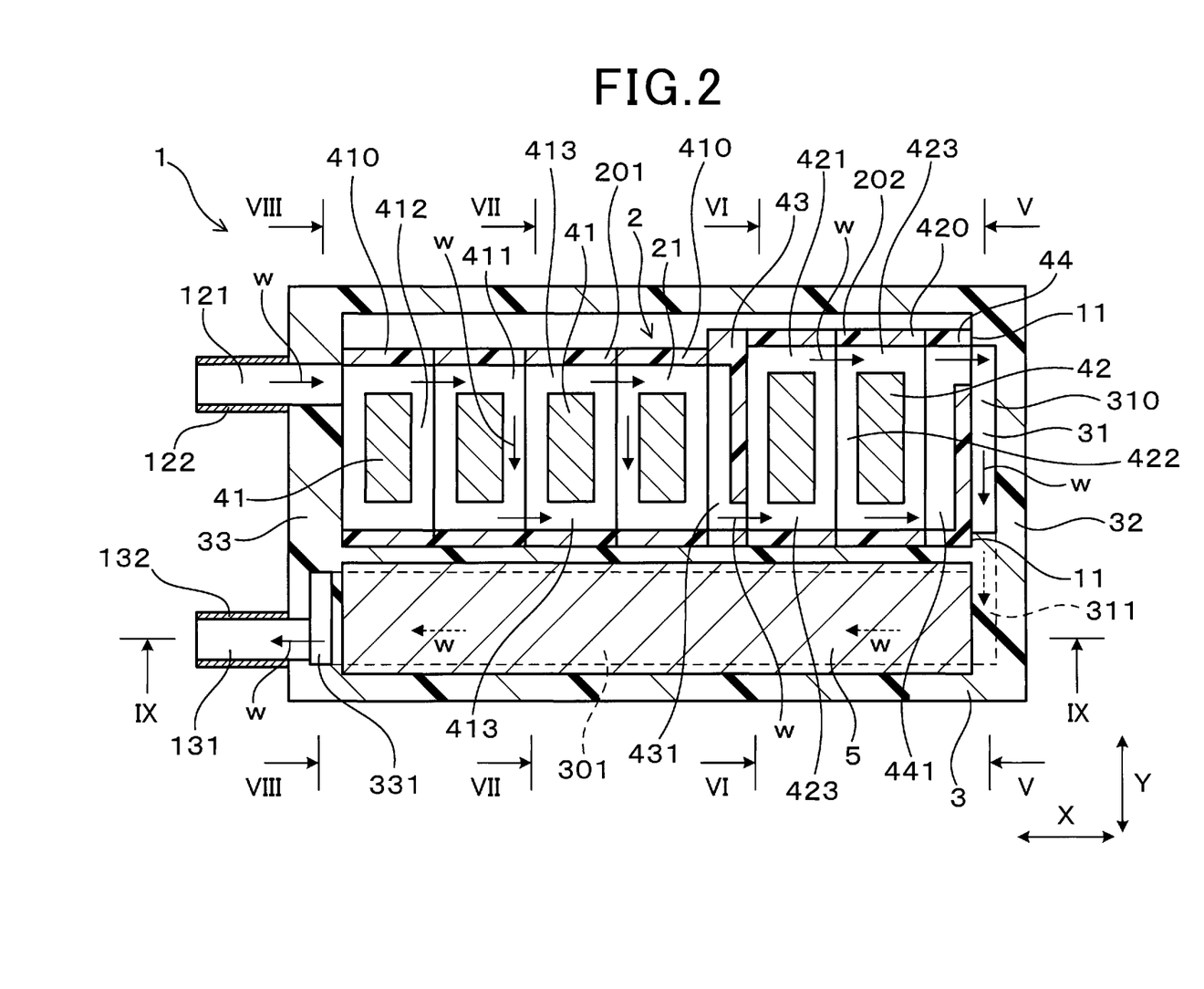
FIG. 2 is a longitudinal sectional view which illustrates an electric power converter in an embodiment.

The electrical power converter 1, as clearly illustrated in FIGS. 1 and 2, includes the stack body 2 and the housing 3 in which the stack body 2 is disposed.

The stack body 2 is made of a stack of a plurality of electronic devices and cooling medium flow paths 21 through which cooling medium flows. The cooling medium flow paths 21 will also be referred to below as in-stack flow path. The electronic devices in the stack body 2 include the semiconductor devices 41 and the reactors 42.

The housing 3 has a given length with the end walls 33 and 32 which will also be referred to below as the front wall 33 and the rear wall 32. The rear wall 32 faces the stack body 2 in a direction in which the electronic devices and the cooling medium flow paths 21 are stacked (i.e., a lengthwise direction of the stack body 2) which will also be referred to below as a stacking direction X. The rear wall will also be referred to below as a stack facing wall. The rear wall 32 has formed therein the in-wall flow path 31 through which the cooling medium flows. The in-wall flow path 31 is connected to the cooling medium flow paths 21.

The stack body 2 has a first and a second end opposed to each other in the stacking direction X (which will also be referred to as a front end and a rear end). The rear end has a surface which forms a portion of an inner surface of the in-wall flow path 31. In the following discussion, the stacking direction X of the stack body 2 will also be simply referred to as a direction X. A region where there is the rear wall 32 of the stack body 2 in the direction X will be referred to as a rear side, while the other side will be referred to as a front side. This definition is only for descriptive purposes, but does not limit the orientation of the electrical power converter 1.

The stack body 2 and the rear wall 32 are joined together.

The stack body 2 is made of a stack of a plurality of component modules 410 and 420. The component modules 410 and 420 include the electronic devices and the component integral flow paths 411 and 421. The component integral flow paths 411 and 421 are integrated with the electronic devices and form portions of the cooling medium flow paths 21. In this embodiment, the component modules 410 include the semiconductor modules 410 equipped with the semiconductor devices 41. The component modules 420 include the reactor modules 420 equipped with the reactors 42.

Each of the semiconductor modules 410 includes the semiconductor device 41, such as an IGBT (Insulated Gate Bipolar Transistor) or a MOSFET (Metal-Oxide Semiconductor Field-Effect Transistor), and the component integral flow path 411.

Figure 3:
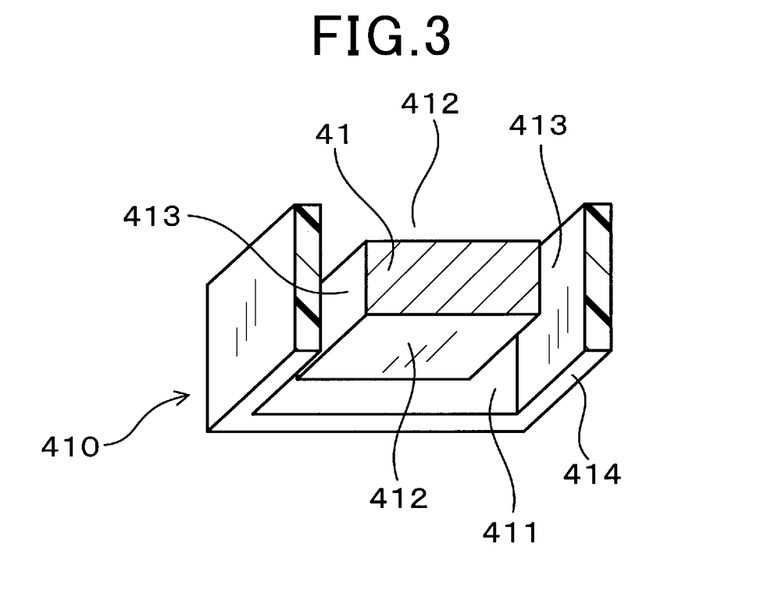
FIG. 3 is a perspective sectional view which illustrates a semiconductor module installed in the electric power converter of FIG. 1.

Each of the semiconductor modules 410 is, as illustrated in FIG. 3, made of the semiconductor device 41 moulded with resin. The resin-mould of each of the semiconductor modules 410 includes the resin frame 414 which defines the component integral flow path 411. The component integral flow path 411 is located adjacent the semiconductor device 41.

The component integral flow path 411 includes front flow paths 412 and the side flow paths 413. The front flow paths 412 are opposed to each other through the semiconductor device 41 in the direction X. The side flow paths 413 are opposed to each other through the semiconductor device 41 in a direction Y perpendicular to the direction X. In this disclosure, the direction Y is a direction which is oriented perpendicular to the direction X and in which the semiconductor device 41 is aligned with the side flow paths 413. A direction perpendicular both to the direction X and to the direction Y will be referred to below as direction Z.

Figure 4:
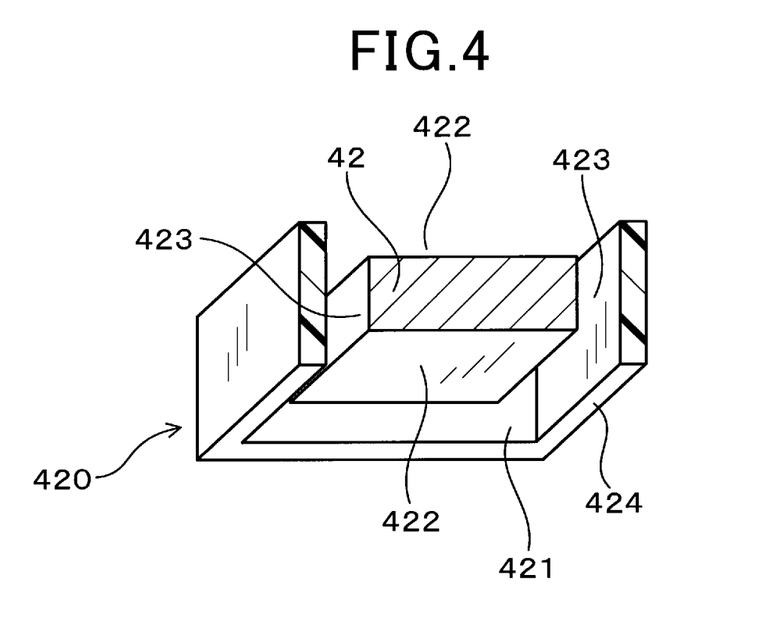
FIG. 4 is a perspective sectional view which illustrates a reactor module installed in the electric power converter of FIG. 1.
Figure 5:
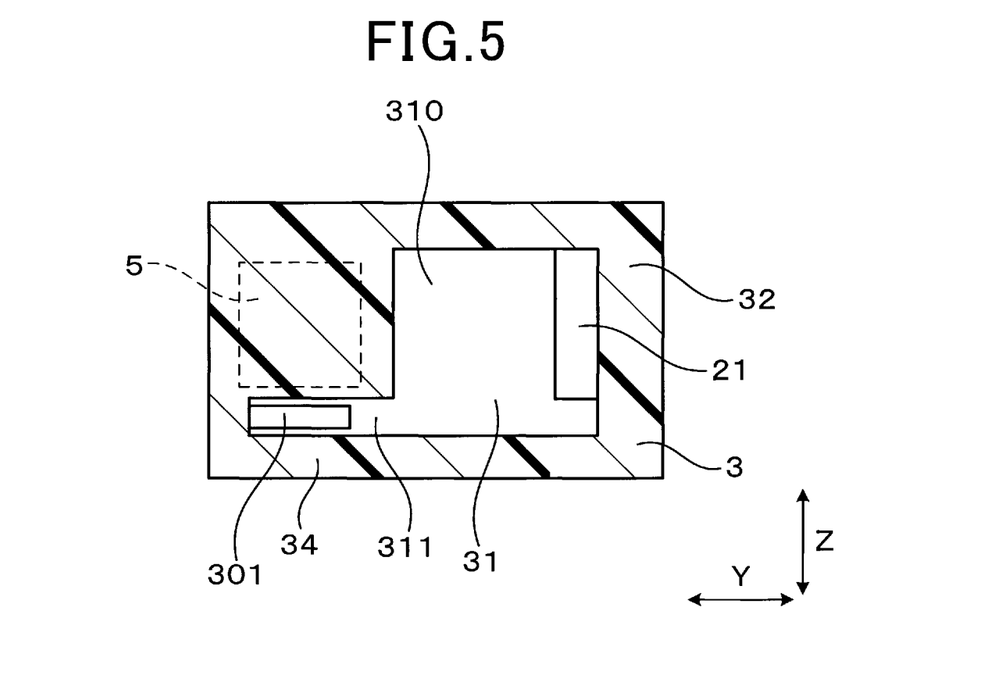
FIG. 5 is a sectional view taken along the line V-V in FIG. 2.

Each of the reactor modules 420, as illustrated in FIG. 4, includes the reactor 42 and the component integral flow path 421. The reactor module 420 is made of the reactor 42 moulded with resin. The resin-mould of each of the reactor modules 420 includes the resin frame 424 which defines the component integral flow path 421. The component integral flow path 421 is located adjacent the reactor 42. The component integral flow path 421 includes the front flow paths 422 and the side flow paths 423. The front flow paths 422 are opposed to each other through the reactor 42 in the direction X. The side flow paths 423 are opposed to each other through the reactor 42 in the direction Y.

The stack body 2, as can be seen in FIGS. 1 and 2, has the component modules 410 and 420 joined together. Specifically, the stack body 2 is fabricated by placing the semiconductor modules 410 and the reactor modules 420 to overlap each other in the direction X and then join them together. The stack body 2 includes the semiconductor stack 201 and the reactor stack 202. The semiconductor stack 201 is made of a stack of the semiconductor modules 410. The reactor stack 202 is made of a stack of the reactor modules 420. The reactor stack 202 is arranged in the rear of the semiconductor stack 201 in the direction X.

The stack body 2 also includes the intermediate block 43 and the rear end block 44 which are aligned and joined with the component modules 410 and 420 in the direction X. The intermediate block 43 is interposed between the semiconductor stack 201 and the reactor stack 202. The rear end block 44 lies at the rear end of the stack body 2 and is interposed between the reactor stack 202 and the rear wall 32.

The intermediate block 43 and the rear end block 44 have formed therein the connecting flow paths 431 and 441 which form portions of the cooling medium flow paths 21, respectively. Specifically, the connecting path 431 of the intermediate block 43 connects between the component integral flow paths 411 of the semiconductor modules 410 and the component integral flow paths 421 of the reactor modules 420. The connecting path 441 of the rear end block 44 connects between the component integral flow paths 421 of the reactor modules 420 and the in-wall flow path 31.

The cooling medium flow paths 21 are defined by the intermediate block 43, the rear end block 44, the component integral flow paths 411 of the semiconductor modules 410, and the reactor modules 420.

The housing 3 is, as clearly illustrated in FIG. 1, of substantially a cuboid shape and includes, as can be seen in FIG. 2, the rear wall 32 facing the rear end of the stack body 2 in the direction X. The housing 3 also includes the front wall 33 which faces the front end of the stack body 2 in the direction X. The housing 3 also includes, as illustrated in FIGS. 5 to 9, the bottom wall 34 which faces in the direction X.

The housing 3 may not be necessarily made of a single-piece member, but may alternatively be made up of a plurality of parts joined together. For instance, the rear wall 32 may be designed to be discrete from a main body of the housing 3 including the bottom wall 34 and joined to the main body to complete the housing 3.

The stack body 2 has the front end placed in contact with the front wall 33 of the housing 3. The stack body 2 also has the rear end placed in contact with the rear wall 32 of the housing 3. Specifically, the semiconductor module 410 arranged at the front end of the stack body 2 is joined to the front wall 33 of the housing 3. The rear end block 44 arranged at the rear end of the stack body 2 is joined to the rear wall 32 of the housing 3. The rear end block 44 is joined to the reactor module 420. The intermediate block 43 is joined to one of the reactor modules 420 which is arranged just in rear thereof. The intermediate block 43 is also joined to one of the semiconductor modules 410 which is arranged just in front thereof.

Every adjacent two of the semiconductor modules 410 of the semiconductor stack 201 are joined together. Similarly, every adjacent two of the reactor modules 420 of the reactor stack 202 are joined together.

The stack body 2 and the housing 3 have outer contacts 11 which are located outside the in-wall flow path 31 in the radial direction thereof and placed in contact with each other. The outer contact 11 of each of the stack body 2 and the housing 3 is at least made of resin. The stack body 2 and the housing 3 are adhered or welded together at the outer contacts 11.

In this embodiment, the housing 3 is entirely made from thermoplastic resin. The stack body 2 and the housing 3 are adhered or welded together at the outer contacts 11. Each of the component modules 410 and 420, the intermediate block 43, and the rear end block 44 of the stack body 2 has at least ends which are opposed to each other in the direction X and made from thermoplastic resin. Each of the component modules 410 and 420 is adhered or welded to adjacent one of them.

Figure 6:
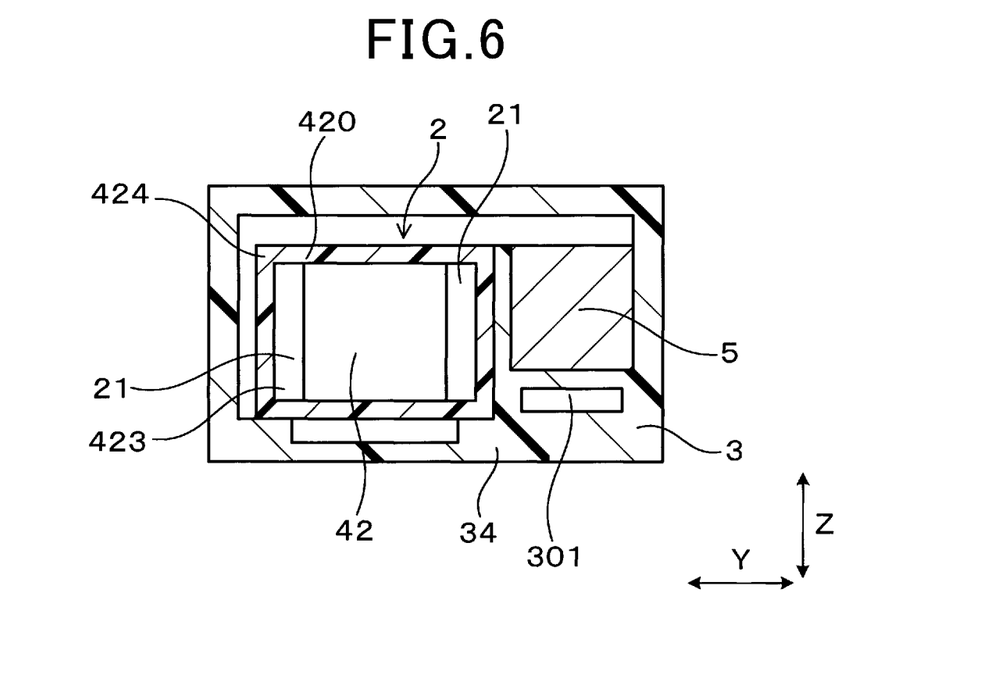
FIG. 6 is a sectional view taken along the line VI-VI in FIG. 2.
Figure 7:
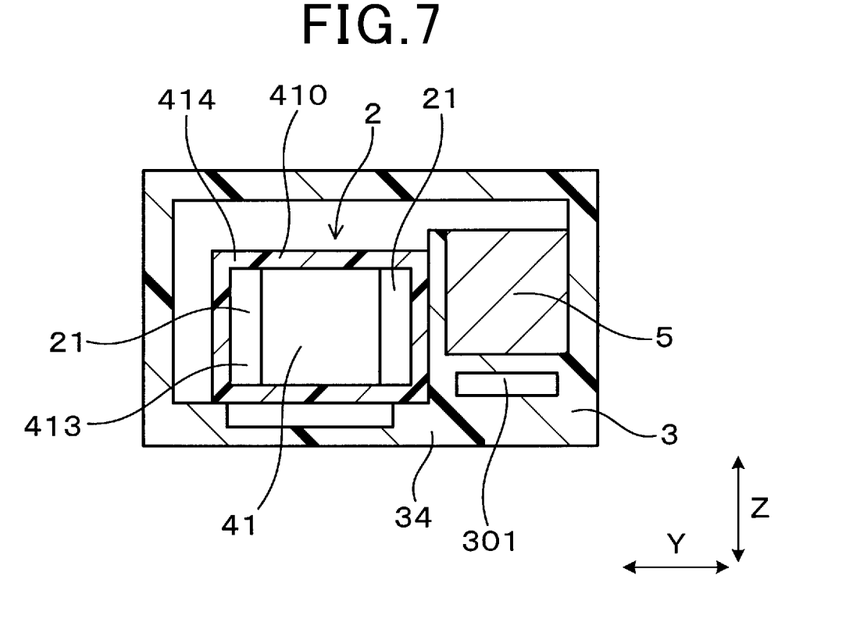
FIG. 7 is a sectional view taken along the line VII-VII in FIG. 2.
Figure 9:
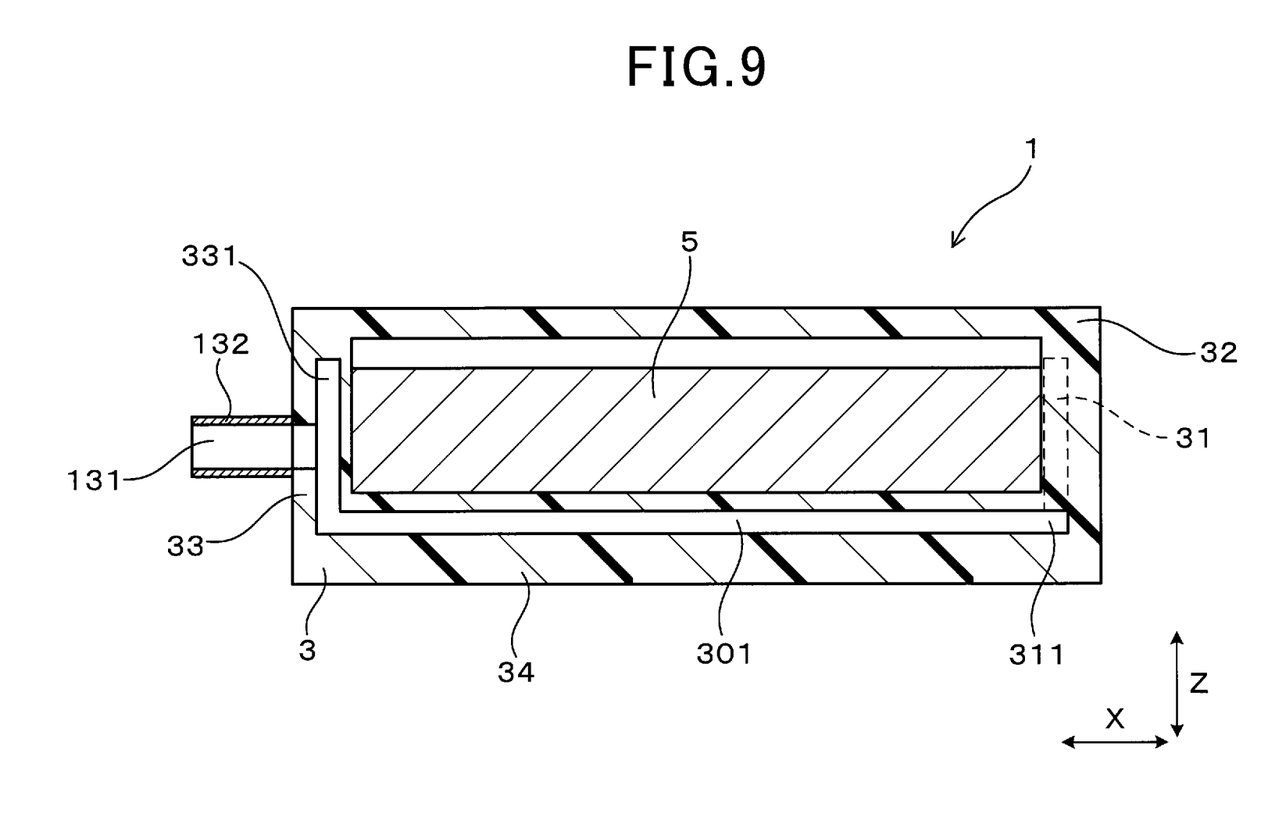
FIG. 9 is a sectional view taken along the line IX-IX in FIG. 2.

The housing 3, as clearly illustrated in FIGS. 6, 7, and 9, has the auxiliary cooling medium flow path 301 which is formed in a portion of the rear wall 32 other than a portion thereof in which the in-wall flow path 31 is formed and communicates with the in-wall flow path 31. Component part(s) which usually generate heat other than the semiconductor devices 41 and the reactors 42 are placed thermally in contact with the auxiliary cooling medium flow path 301. In this embodiment, such component part(s) includes the capacitor 5 which has a plurality of capacitor devices, not shown, disposed therein.

The capacitor 5 is, as clearly illustrated in FIG. 2, arranged adjacent the stack body 2 in the direction Y. The auxiliary cooling medium flow path 301 is, as illustrated in FIGS. 6, 7, and 9, arranged to face the capacitor 5 in the direction Z. The capacitor 5, as illustrated in FIGS. 2 and 9, has a length extending in the direction X. The capacitor 5 extends substantially over the length of the housing 3 in the direction X.

The auxiliary cooling medium flow path 301 is formed in the bottom wall 34 of the housing 3. The auxiliary cooling medium flow path 301 is connected at a rear end thereof to the in-wall flow path 31. The in-wall flow path 31, as clearly illustrated in FIGS. 2 and 5, includes the main flow path 310 and the connecting flow path 311. The main flow path 310 extends to face the stack body 2. The connecting flow path 311 connects between the main flow path 310 and the auxiliary cooling medium flow path 301.

Figure 8:
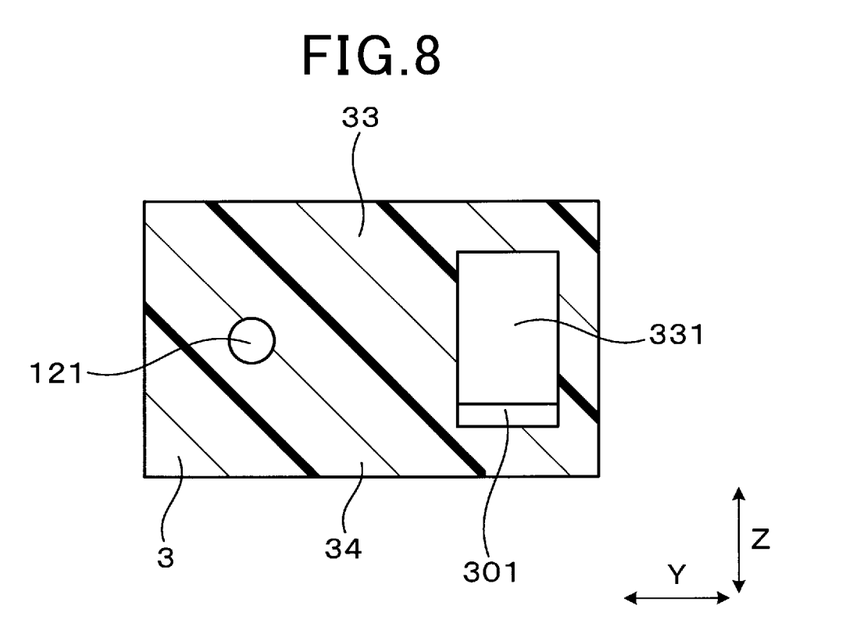
FIG. 8 is a sectional view taken along the line VIII-VIII in FIG. 2.

The auxiliary cooling medium flow path 301 is, as clearly illustrated in FIGS. 8 and 9, also connected at a front end thereof to the front flow path 331 formed in the front wall 33. The front flow path 331 extends from the front end of the auxiliary cooling medium flow path 301 away from the bottom wall 34 in the direction Z. The front flow path 331 faces the capacitor 5 in the direction X.

The cooling medium outlet path 131 is connected to the front flow path 331. The cooling medium outlet path 131 is formed in the outlet pipe 132 extending frontward from the front wall 33 of the housing 3.

The cooling medium flow path 21 is, as clearly illustrated in FIG. 2, connected at a front end thereof to the cooling medium inlet path 121. The cooling medium inlet path 121 is formed in the inlet pipe 122 extending frontward from the front wall 33 of the housing 3.

After inputted from the cooling medium inlet path 121, the cooling medium passes through the cooling medium flow paths 21 in the stack body 2 to the in-wall flow path 31. In FIG. 2, the arrows w represent flows of the cooling medium. The cooling medium in the cooling medium flow paths 21 serves to cool the semiconductor devices 41 and the reactors 42. After passing through the cooling medium flow paths 21 in the semiconductor stack 201, the cooling medium is delivered to the cooling medium flow paths 21 in the reactor stack 202.

In the cooling medium flow paths 21 in the semiconductor stack 201, the cooling medium flows through the side flow paths 413 extending away from each other in the direction Y. Specifically, the cooling medium flows front to back in the direction X in the side flow paths 413. In each of the front flow paths 412, the cooling medium flows from one end to the other of the front flow path 412 in the direction Y. Specifically, in each of the front flow paths 412, the cooling medium flows in the direction Y from the side flow path 413 which is farther away from the capacitor 5 to the side flow path 413 which is closer to the capacitor 5.

After passing through the semiconductor stack 201, the cooling medium flows in the connecting path 431 in the intermediate block 43 and then enters the cooling medium flow paths 21 in the reactor stack 202. Specifically, the cooling medium enters one of the cooling medium flow paths 21 which is located at one (i.e., a lower side, as viewed in FIG. 2) of the sides of the reactor stack 202 opposed to each other in the direction Y. More specifically, the cooling medium first enters the cooling medium flow path 21 which is arranged closer to the capacitor 5 in the reactor stack 202.

The cooling medium flow paths 21 in the reactor stack 202, as described above, include the side flow paths 423 arranged away from each other in the direction Y. The cooling medium flows front to back in the side flow paths 423 in the direction X. The cooling medium also flows in each of the front flow paths 422 upward, as viewed in FIG. 2, from the side flow path 423 located closer to the capacitor 5 to the side flow path 423 located farther away from the capacitor 5 in the direction Y.

After passing through the reactor stack 202, the cooling medium moves from one of ends of the connecting path 441 which is farther away from the capacitor 5 in the direction Y within the rear end block 44 into the in-wall flow path 31. The cooling medium flows in the in-wall flow path 31 and is then delivered into the auxiliary cooling medium flow path 301 through the connecting path 311.

In the auxiliary cooling medium flow path 301, the cooling medium moves back to front in the direction X to cool the capacitor 5. After passing through the auxiliary cooling medium flow path 301, the cooling medium is drained from the front flow path 331 into the cooling medium outlet path 131.

In the above way, the cooling medium is circulated from the cooling medium inlet path 121 to the cooling medium outlet path 131 within the electrical power converter 1, thereby achieving thermal exchange with the semiconductor devices 41, the reactors 42, and the capacitor 5 in this order. This cools the semiconductor devices 41 which usually generate the greatest amount of heat with the cooling medium which is lowest in temperature.

The cooling medium may be a natural cooling medium, such as water or ammonia, water with which ethylene glycol antifreeze fluid is mixed, fluorocarbon cooling medium, such as Fluorinert, fluorocarbon cooling medium, such as HCFC-123 or HFC-134a, alcohol cooling medium, such as methanol or alcohol, or ketone-based cooling medium, such as acetone.

The electrical power converter 1 in this embodiment may be used with automotive vehicles such as electric vehicles or hybrid vehicles.

The first embodiment offers the following advantages.

The housing 3 of the electrical power converter 1 has the in-wall flow path 31 connecting with the cooling medium flow paths 21. The in-wall flow path 31 is formed in the rear wall 32 facing the reactor stack 202. This achieves a simple joint between the cooling medium flow paths 21 and the in-wall flow path 31 within the housing 3 without need for a connecting pipe arranged outside the housing 3 to connect the cooling medium flow paths 21 and the in-wall flow path 31 together. This enables the electrical power converter 1 to be reduced in size thereof.

There is, as described above, no need for a connecting pipe disposed outside the housing 3, thus leading to no concern about mechanical interference of the connecting pipe with peripheral members. This facilitates the ease of installation of the electrical power converter 1. There is also no concern about sealing of a joint of the connecting pipe to the housing 3. The elimination of need for such a connecting pipe results in saving of parts used to make the electrical power converter 1.

An inner surface of ends of the stack body 2 opposed to each other in the direction X forms a portion of an inner surface of the in-wall flow path 31, thereby resulting in a decrease in number of parts used to make the electrical power converter 1 and also enabling the electrical power converter 1 to be reduced in size thereof.

The stack body 2 and the rear wall 32 are joined together, thereby ensuring sealing of the in-wall flow path 31.

The stack body 2 is made of a stack of the component modules 410 and 420 equipped with the electronic devices and the component integral flow paths 411 and 421. This structure facilitates the ease with which the stack body 2 in which the cooling medium flow paths 21 are formed is fabricated.

The stack body 2 is made by joining the component modules 410 and 420 to each other, thereby facilitating and ensuring the stability of structural connections of the component integral flow paths 411 and 421. In other words, it is easy to make the cooling medium flow paths 21 with a high degree of sealing without any air gaps between the component integral flow paths 411 and 421.

The stack body 2 and the housing 3 have the outer contacts 11 at least made from resin, thereby enhancing the degree of sealing of the in-wall flow path 31.

The stack body 2 and the housing 3 are resin-welded together at the outer contacts 11, thereby easily minimizing air gaps between the outer contacts 11.

The housing 3 has formed therein the auxiliary cooling medium flow path 301 with which a heat-generating device (i.e., the capacitor 5) is placed in thermal contact. This cools the capacitor 5 using the cooling medium mainly used to cool the electronic devices (i.e., the semiconductor devices 41 and the reactors 42) mounted the stack body 2. It is, thus, possible to reduce the size of the electrical power converter 1 without sacrificing the cooling of the capacitor 5.

The formation of the auxiliary cooling medium flow path 301 in the electric power converter 1 to cool the heat-generating device or capacitor 5 facilitates the ease with which the electric power converter 1 required to minimize a rise in temperature of the capacitor 5 is reduced in size thereof.

The stack body 2 is equipped with the semiconductor devices 41, thereby minimizing a rise in temperature of the semiconductor devices 41 using the cooling medium flowing through the cooling medium flow paths 21.

The stack body 2 is also equipped with the reactors 42, thereby minimizing a rise in temperature of the reactors 42 using the cooling medium flowing through the cooling medium flow paths 21.

As apparent from the above discussion, the embodiment provides the electric power converter 1 which is enabled to be reduced in size thereof.

The electrical power converter 1 in this embodiment has the auxiliary cooling medium flow path 301 formed therein, but however, may alternatively be designed not to have the auxiliary cooling medium flow path 301. For example, the electrical power converter 1 may be engineered to have the in-wall flow path 31 leading to the cooling medium flow paths 21 and also have an electronic device, such as a capacitor or a DC-DC converter other than the components of the stack body 2, which is placed in thermal contact with the in-wall flow path 31.

The joint of the stack body 2 and the rear wall 32 may be achieved in a variety of ways other than welding. For example, such joining may be made using friction diffusion welding techniques. The joint between the component modules 410 and 420 or between the stack body 2 and the front wall 33 may be achieved in a known way other than welding.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modifications to the shown embodiment which can be embodied without departing from the principle of the invention as set forth in the appended claims.

What is claimed is:

1. An electric power converter comprising:
a stack body including a stack of a plurality of electronic devices and a plurality of in-stack flow paths through which a cooling medium flows; and
a housing in which the stack body is disposed, the housing having a first stack facing wall and a second stack facing wall opposed to each other through the stack body in a stacking direction in which the plurality of electronic devices and the plurality of in-stack flow paths are stacked, the first stack facing wall having an in-wall flow path in which the cooling medium flows, the in-wall flow path communicating with the plurality of in-stack flow paths, and the second stack facing wall having a cooling medium inlet path and a cooling medium outlet path formed in the second stack facing wall, the cooling medium inlet path and the cooling medium outlet path communicating with the plurality of in-stack flow paths.

2. The electric power converter as set forth in claim 1, wherein the stack body has a first end and a second end opposed to each other in the stacking direction, the second end being closer to the second stack facing wall than the first end, and the second end having a surface forming a portion of an inner wall of the in-wall flow path.

3. The electric power converter as set forth in claim 2, wherein the stack body and the first and second stack facing walls are joined together.

4. The electric power converter as set forth in claim 2, wherein the stack body is made of a stack of a plurality of component modules that are integrated with the plurality of electronic devices, and plurality of component integral flow paths are arranged in the plurality of component modules, the component integral flow paths forming portions of the plurality of in-stack flow paths.

5. The electric power converter as set forth in claim 4, wherein the stack body is made of the plurality of component modules joined to each other.

6. The electric power converter as set forth in claim 2, wherein the stack body and the housing have outer contacts that are located outside a periphery of the in-wall flow path and that are placed in contact with each other, the outer contact of each of the stack body and the housing being made of at least resin.

7. The electric power converter as set forth in claim 6, wherein the stack body and the housing are welded together at the outer contacts.

8. The electric power converter as set forth in claim 1, wherein:
the housing includes an auxiliary cooling medium flow path that is formed in a portion of the stack facing wall other than a portion of the stack facing wall in which the in-wall flow path is formed, the auxiliary cooling medium flow path communicating with the in-wall flow path, and a heat-generating device other than the plurality of electronic devices is placed in thermal contact with the auxiliary cooling medium flow path.

9. The electric power converter as set forth in claim 8, wherein the heat-generating device is a capacitor.

10. The electric power converter as set forth in claim 1, wherein the stack body is equipped with semiconductor devices as the plurality of electronic devices.

11. The electric power converter as set forth in claim 10, wherein the stack body is equipped with both the semiconductor devices and reactors as the plurality of electronic devices.

* * * * *